United States Patent
Yusa et al.

(12) United States Patent (10) Patent No.: US 6,331,729 B1
Yusa et al. (45) Date of Patent: Dec. 18, 2001

(54) CHIP SUPPORTING SUBSTRATE FOR SEMICONDUCTOR PACKAGE, SEMICONDUCTOR DEVICE, AND METHOD FOR MANUFACTURING THEM

(75) Inventors: Masami Yusa, Shimodate; Toshihiko Kato; Fumio Inoue, both of Tsukuba; Shigeki Ichimura, Oyama, all of (JP)

(73) Assignee: Hitachi Chemical Company, Ltd. (JP)

( * ) Notice: Subject to any disclaimer, the term of this patent is extended or adjusted under 35 U.S.C. 154(b) by 0 days.

(21) Appl. No.: 09/297,296
(22) PCT Filed: Oct. 29, 1997
(86) PCT No.: PCT/JP97/03923
   § 371 Date: Aug. 10, 1999
   § 102(e) Date: Aug. 10, 1999
(87) PCT Pub. No.: WO98/19338
   PCT Pub. Date: May 7, 1998

(30) Foreign Application Priority Data
Oct. 30, 1996 (JP) .................................................. 8-288606

(51) Int. Cl.[7] .................................................. H01L 23/40
(52) U.S. Cl. .................... 257/678; 257/676; 257/680; 257/684; 257/711; 257/731
(58) Field of Search ................................... 257/676, 678, 257/680, 684, 711, 731

(56) References Cited

U.S. PATENT DOCUMENTS

| | | | |
|---|---|---|---|
| 4,760,440 | * 7/1988 | Bigler et al. | 257/680 |
| 4,835,598 | * 5/1989 | Higuchi et al. | 357/72 |
| 5,159,433 | * 10/1992 | Kazami et al. | 257/731 |
| 5,414,299 | * 5/1995 | Wang et al. | 257/737 |

FOREIGN PATENT DOCUMENTS

| | | |
|---|---|---|
| 06-1883328 | 7/1994 | (JP) . |
| 08-250890 | 9/1996 | (JP) . |

OTHER PUBLICATIONS

Nikkei Materials & Technology, 94.4, No. 140, pp. 18–19.
M. Mstruo et al., "Smallest Flip–Chip–Like Package CSP; The Second VLSI Packaging Workshop Of Japan", pp. 46–50, 1994.

* cited by examiner

Primary Examiner—Fetsum Abraham
(74) Attorney, Agent, or Firm—Pennie & Edmonds LLP

(57) ABSTRACT

In the present invention, an insulating film adhesive material is attached onto the wirings in the form of a tent so that an empty space communicating with a vent hole is provided. Use of this chip-supporting substrate makes it possible to produce small-sized semiconductor packages preventive of package cracking and having a high reliability, because the function of the vent hole is not damaged and also gases and water vapor which are generated from the insulating film adhesive material at the time of reflowing can be driven off surely outside the package.

3 Claims, 1 Drawing Sheet

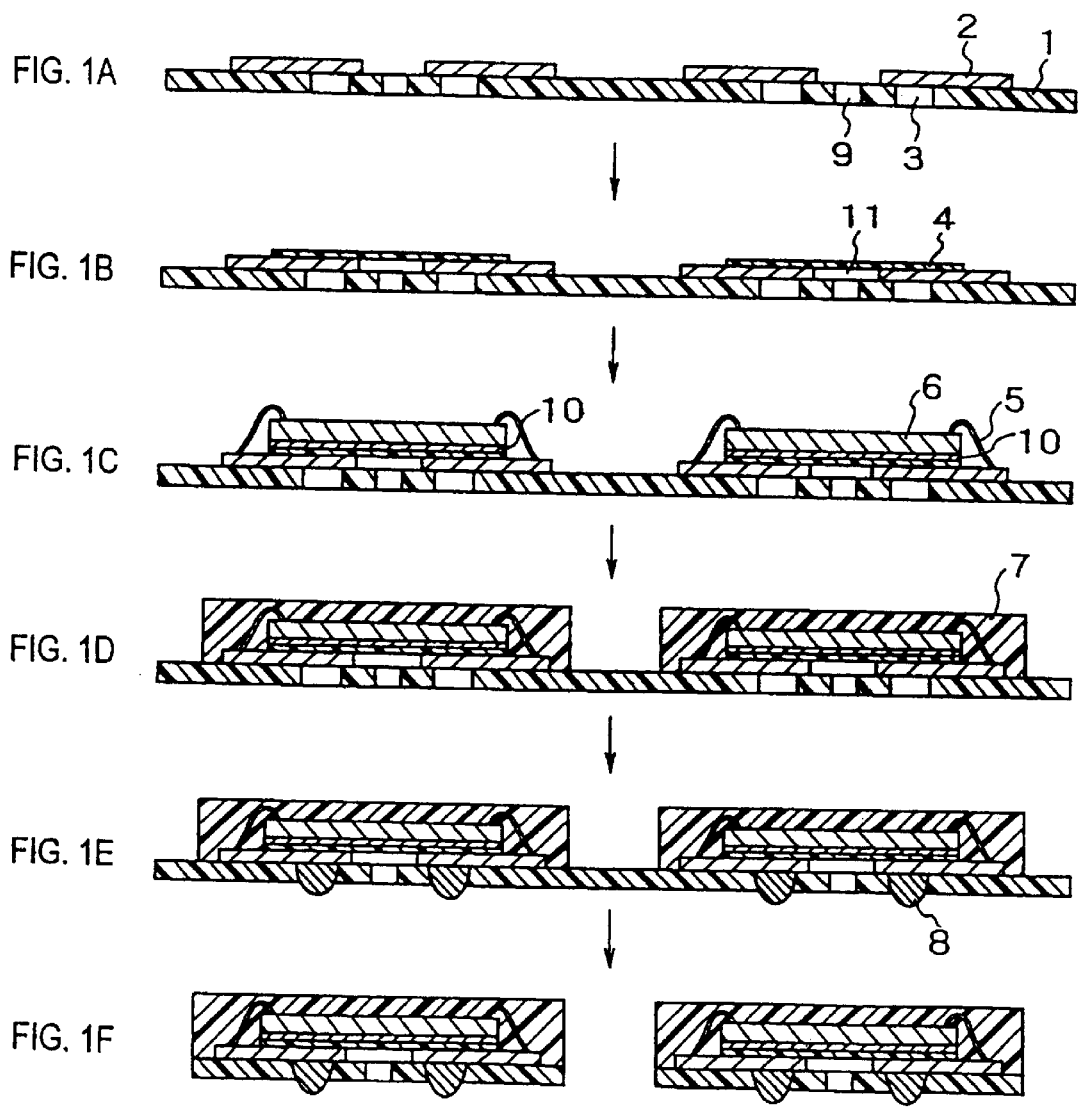

CHIP SUPPORTING SUBSTRATE FOR SEMICONDUCTOR PACKAGE, SEMICONDUCTOR DEVICE, AND METHOD FOR MANUFACTURING THEM

TECHNICAL FIELD

This invention relates to a semiconductor packaging chip-supporting substrate, a process for producing the substrate, a semiconductor device making use of the substrate, and a process for fabricating the semiconductor device.

BACKGROUND ART

As semiconductors have become more highly integrated, the number of input-output terminals has increased. Accordingly, semiconductor packages having a large number of input-output terminals have become required. Input-output terminals are commonly grouped into a type where the terminals are arranged in a line on the perimeter of a semiconductor package and a type where they are arranged in lines not only on the perimeter but also in the inner area of a semiconductor package.

The former is typified by QFP (quad flat package). To make it have more terminals, terminal pitches must be made narrower. However, in a region of 0.5 mm pitch or less, a high-grade technique is required to connect terminals to a wiring board.

The latter array type enables arrangement of terminals at relatively large pitches, and hence is suited for multipin construction. As the array type, PGA (pin grid array), having connecting pins, has commonly been available. This, however, is of an insert type for its connection with a wiring board, and is not suited for face packaging. Accordingly, a package called BGA (ball grid array), which enables face packaging, has been developed.

Meanwhile, as electronic instruments are made compact, there is a stronger demand for making package size smaller. As a package that meets such a demand for smaller size, what is called a chip-size package (CSP) is proposed. This is a package having portions connecting with an external wiring substrate, not on the perimeter of a semiconductor chip but in its packaging region. As specific examples, it includes those in which a polyimide film with bumps is bonded to the surface of a semiconductor chip so as to make electrical interconnection with the chip through gold lead wires, followed by potting of epoxy resin or the like to effect encapsulating (NIKKEI MATERIALS & TECHNOLOGY 94.4, No. 140, pp.18–19), and those in which metal bumps are formed at positions corresponding to portions where a semiconductor chip connects with an external wiring substrate, and the semiconductor chip is face-down bonded, followed by transfer molding on a provisional substrate (Smallest Flip-chip-like Package CSP; The Second VLSI Packaging Workshop of Japan, pp.46–50, 1994).

However, it does not mean that most semiconductor packages hitherto proposed are small-sized and adaptable to high integration and also to be preventive of package cracking and have a superior reliability and yet to have a superior productivity.

DISCLOSURE OF THE INVENTION

The present invention provides a semiconductor packaging chip-supporting substrate that can prevent package cracking and make it possible to produce a small-sized semiconductor package having a superior reliability, a semiconductor device making use of such a substrate, and processes for producing them.

The semiconductor packaging chip-supporting substrate of the present invention comprises:

A. an insulating supporting substrate on one surface of which at least two wirings having semiconductor chip mount areas are so formed as to be disposed in such a way that, when a semiconductor chip is mounted at the semiconductor chip mount areas of the wirings, an empty space is formed by the bottom surface of the semiconductor chip, the side surfaces of the wirings and the surface of the insulating supporting substrate;

B. at least one through-hole formed in the insulating supporting substrate at its part facing the empty space; and C. an insulating film adhesive material formed at a semiconductor chip mount region where the semiconductor chip is to be mounted, inclusive of the semiconductor chip mount areas of the wirings;

the insulating film adhesive material being an insulating film adhesive material having a Tg (glass transition temperature) of 100° C. or above and a residual volatile component of 2.0% (weight by weight) or less at least at the stage where the semiconductor chip is mounted via the insulating film adhesive material.

In the present invention, the insulating film adhesive material having a Tg of 100° C. or above and a residual volatile component of 2.0% (weight by weight) or less may be formed at the semiconductor chip mount region. Alternatively, an insulating film adhesive material having a Tg of 80° C. or above and a residual volatile component of 15.0% (weight by weight) or less may be formed at the semiconductor chip mount region and then the insulating film adhesive material may be subjected to heat treatment at a stage prior to the stage where the semiconductor chip is mounted via the insulating film adhesive material, to make the insulating film adhesive material have a Tg of 100° C. or above and a residual volatile component of 2.0% (weight by weight) or less.

In a preferred embodiment, the semiconductor packaging chip-supporting substrate of the present invention comprises:

A'. an insulating supporting substrate on one surface of which at least two wirings having inner-connecting areas for making connection with semiconductor chip electrodes and semiconductor chip mount areas are so formed as to be disposed in such a way that, when a semiconductor chip is mounted at the semiconductor chip mount areas of the wirings via an insulating film adhesive material, an empty space is formed by the surface of the insulating film adhesive material on its side facing the insulating supporting substrate, the side surfaces of the wirings and the surface of the insulating supporting substrate;

B'. openings provided in the insulating supporting substrate at its part on which the wirings are formed and at which outer-connecting areas conducting to the inner-connecting areas are provided;

C'. at least one through-hole formed in the insulating supporting substrate at its part facing the empty space; and D'. an insulating film adhesive material formed at a semiconductor chip mount region where the semiconductor chip is to be mounted, inclusive of the semiconductor chip mount areas of the wirings;

the insulating film adhesive material being an insulating film adhesive material having a Tg of 100° C. or above and a residual volatile component of 2.0% (weight by weight) or less at least at the stage where the semiconductor chip is mounted via the insulating film adhesive material.

The present invention also provides a process for producing a semiconductor packaging chip-supporting substrate, the process having the following steps (1) to (3):
(1) A through-hole forming step of forming a through-hole in an insulating supporting substrate;
(2) a wiring forming step of forming on one surface of the insulating supporting substrate at least two wirings having semiconductor chip mount areas, so formed as to be disposed in such a way that, when a semiconductor chip is mounted at the semiconductor chip mount areas of the wirings, an empty space is formed by the bottom surface of the semiconductor chip, the side surfaces of the wirings and the surface of the insulating supporting substrate; and
(3) an adhesive layer forming step of forming an insulating film adhesive material having the above properties, at a semiconductor chip mount region where the semiconductor chip is to be mounted, inclusive of the semiconductor chip mount areas of the wirings.

The adhesive layer (insulating film adhesive material) may be formed by, e.g., attaching the insulating film adhesive material having the above properties [i.e., a glass transition temperature of 100° C. or above and a residual volatile component of 2.0% (weight by weight) or less] to the semiconductor chip mount region. Alternatively, it may be formed by forming previously (e.g., by attaching a film) an insulating film adhesive material having a glass transition temperature of 80° C. or above and a residual volatile component of 15.0% (weight by weight) or less, at the semiconductor chip mount region and then subjecting this insulating film adhesive material to heat treatment before the semiconductor chip is mounted, to make it have the above properties.

In the case when the adhesive layer forming step comprises the step of attaching the insulating film adhesive material, the insulating film adhesive material to be attached may preferably be a self-supporting film from the viewpoint of workability.

The present invention also provides a semiconductor device having the chip-supporting substrate of the present invention, a semiconductor chip mounted on the chip-supporting substrate at its semiconductor chip mount region and a sealing member for encapsulating the semiconductor chip, and a process for fabricating the semiconductor device.

The insulating supporting substrate suited for the present invention may include films formed of a plastic of polyamide, epoxy resin or polyimide and those formed by impregnating a base material such as a glass nonwoven fabric with the plastic of polyamide, epoxy resin or polyimide followed by curing.

To form on one surface of the insulating supporting substrate the wirings having semiconductor chip mount areas, usable are a method in which copper foil is etched, a method in which the substrate is copper-plated at the stated part, and a method in which these methods are used in combination.

To provide the openings such as external connecting areas or through-holes in the insulating supporting substrate, they may be formed by mechanical processing such as drilling or punching or by processing with a laser such as an excimer laser or a carbon dioxide laser. Also usable are a method in which openings are made previously in an insulating base material having adhesive properties and such a base material is laminated to a wiring forming metal foil such as copper foil, and a method in which openings are made in an insulating base material provided with copper foil or with wirings formed previously, or a method in which these methods are used in combination. The outer-connecting areas conducting to the inner-connecting areas may be made by forming bumps by using solder balls, plating or the like. These are connected to an external substrate or the like.

As methods of electrically interconnecting the wirings with the semiconductor chip electrodes, the semiconductor chip may be face-up mounted on the wirings at their semiconductor chip mount areas to connect by wire bonding the semiconductor chip electrodes with the inner-connecting areas provided at the wirings, or the semiconductor chip may be face-down mounted on the wirings at their semiconductor chip mount region to connect the semiconductor chip with connecting terminals provided at the wirings.

To connect the wirings of the insulating supporting substrate to the exterior, openings may be provided in the insulating supporting substrate at its portions where the wirings are formed, and external connecting terminals electrically interconnected with the wirings may be provided through the openings on the insulating supporting substrate on its side opposite to the side where the wirings are formed.

As the insulating film adhesive material, usable are single-layer materials or materials comprising a plastic film of polyamide, epoxy resin, polyimide or the like on one side or both sides of which an adhesive is coated.

The insulating film adhesive material may include, e.g., film adhesive materials comprising a thermoplastic resin such as a polyimide resin obtained by allowing a tetracarboxylic dianhydride to react with a diamine, the former containing a tetracarboxylic dianhydride represented by the following general formula (1), in an amount of at least 70 mol % of the total tetracarboxylic dianhydride:

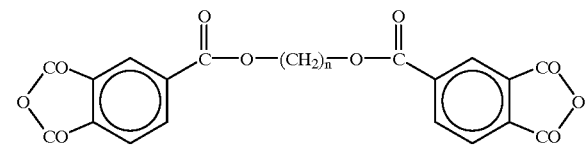

(1)

wherein n represents an integer of 2 to 20;
or an epoxy resin. A filler comprising an inorganic substance such as silica or alumina may further be incorporated in this material.

The insulating film adhesive material provided on the chip-supporting substrate of the present invention has a Tg of 100° C. or above and a residual volatile component of 2.0% (weight by weight) or less at least at the stage where the semiconductor chip is mounted via the insulating film adhesive material.

To make the insulating film adhesive material have a Tg of 100° C. or above and a residual volatile component of 2.0% (weight by weight) or less at the stage where the semiconductor chip is mounted via the insulating film adhesive material, for example, the insulating film adhesive material having a Tg of 100° C. or above and a residual volatile component of 2.0% (weight by weight) or less may be attached as it is, or an insulating film adhesive material having a Tg of 80° C. or above and a residual volatile component of 15.0% (weight by weight) or less may be formed and attached to the substrate and then this insulating film adhesive material may be subjected to heat treatment at a stage prior to the stage where the semiconductor chip is mounted via the insulating film adhesive material.

At least one through-hole is formed in the insulating supporting substrate at its part which comes to face the above empty space. It may preferably have a hole diameter of, but not particularly limited to, e.g., from 0.05 mm to 1.000 mm. A plurality of through-holes, which may be disposed in any manner without particular limitations, may preferably be disposed as uniformly as possible. The hole diameter and disposition may be selected in accordance with wiring patterns.

To produce semiconductor packages by the use of the semiconductor packaging chip-supporting substrate of the present invention, first the semiconductor chip is mounted on the surface of the insulating film adhesive material of the semiconductor packaging chip-supporting substrate. Here, a paste type die bond adhesive may be used in combination. Next, the semiconductor chip electrodes are connected with the inner-connecting areas of the supporting substrate by wire bonding or the like. Then, the semiconductor chip is encapsulated with resin at least on the side including the semiconductor chip electrodes, and solder balls are bonded to the outer-connecting areas, thus the semiconductor package can be produced.

BRIEF DESCRIPTION OF THE DRAWINGS

FIGS. 1A–1F cross-sectionally illustrate a process of semiconductor package production, for describing Examples of the present invention.

BEST MODES FOR PRACTICING THE INVENTION

Example of Die Bond Film Formation (1) Synthesis of polyimide:

In a four-necked flask having a capacity of 1000 ml provided with a thermometer, a stirrer, a nitrogen-introducing pipe and a drying pipe, 41 g (0.1 mol) of 2,2-(4-aminophenoxyphenyl)propane (hereinafter "BAPP") and 374 g of N-methyl-2-pyrrolidone were added to dissolve the former in the latter.

After the BAPP was dissolved, the whole flask was cooled in a water bath, and 52.2 g (0.1 mol) of decamethylene bistrimellitate dianhydride was added little by little with vigorous stirring. As it was, the reaction was carried out in a stream of nitrogen with stirring in a water bath for 6 hours to obtain a polyamic acid solution.

To the polyamic acid solution, 250 g of xylene was added to make imidization proceed while blowing nitrogen gas at 170 to 180° C. and while removing the xylene azeoptropically together with the water. After the reaction was completed, the reaction solution was poured into water, and a polymer precipitated was collected by filtration, followed by drying to obtain polyimide A.

(2) Preparation of epoxy resin solution:

An epoxy resin, a phenol resin and a catalyst were mixed in the quantities shown in Table 1 to obtain epoxy resin solutions 1 to 3.

TABLE 1

| Epoxy resin solution: | Epoxy resin | Phenol resin | Catalyst | Solid matter concentration |
|---|---|---|---|---|
| 1 | R-1710, 5 g EXA-830CR, 5 g | HP-850N, 6.36 g | TPPK, 0.1 g | 10% |
| 2 | ESCN-195, 10 g | HP-850N, 5.3 g | TPPK, 1.0 g | 10% |
| 3 | EPPN-502, 10 g | HP-850N, 6.2 g | TPPK, 1.0 g | 10% |

R-1710: Bisphenol AD epoxy resin
EXA-830CR: Bisphenol F epoxy resin
ESCN-195: Cresol novolak epoxy resin
EPPN-502: Salicylaldehyde novolak epoxy resin
HP-850N: Phenol novolak resin
TPPK: Tetraphenylphosphonium tetraphenyl borate (3) Formation of die bond films:

Films were formed under the formulation and conditions shown in Table 2 below.

TABLE 2

| | Example | | | | | Comparative Example | |
|---|---|---|---|---|---|---|---|
| | 1 | 2 | 3 | 4 | 5 | 1 | 2 |
| Polyimide A: | 10 g | 10 g | 10 g | 10 g | 10 g | 10 g | 10 g |
| Epoxy resin solution: | 1 10 g | 1 10 g | 1 10 g | 3 10 g | 1 10 g | 1 10 g | 2 10 g |
| Drying conditions: | 150° C. 30 min | 150° C. 40 min | 120° C. 40 min | 120° C. 40 min | 80° C. 30 min | 120 C. 40 min | 120° C. 40 min |
| Treatment after film attachment: | | | 150° C. 30 min | | 150° C. 30 min | | |
| Film Tg: | 106° C. | 106° C. | 104° C. | 107° C. | 105° C. | 97° C. | 107° C. |
| Residual volatile component: | 1.9% | 1.2% | 1.8% | 1.9% | 1.3% | 2 2% | 3.0% |
| State of empty space: | Good | Good | Good | Good | Good | Poor | Poor |
| Reflow resistance: | Good | Good | Good | Good | Good | Poor | Poor |

EXAMPLES 1 to 5 &

Comparative Examples 1 & 2

Examples of the present invention will be described with reference to FIGS. 1A–1F.

In a polyimide bonding sheet 1 of 0.07 mm thick obtained by coating a polyimide adhesive on both sides of a polyimide film, openings 3 serving as the outer-connecting areas and through-holes (vent holes) 9 were formed by drilling. Next, copper foil of 0.018 mm thick (trade name: SLP-18; available from Nippon Denkai Ltd.) was bonded, and inner-connecting areas and developed wirings 2 were formed by conventional etching.

Then, wirings standing laid bare were subjected successively to electroless nickel plating (layer thickness: 5 µm) and electroless gold plating (layer thickness: 0.8 µm) (not shown). Incidentally, the electroless plating used here may be replaced with electrolytic plating.

Next, the sheet with these wirings was punched into frame by using a punching mold to prepare a supporting substrate on and in which sets of inner-connecting areas, developed wirings and outer-connecting areas were formed [FIG. 1A]. As a method of producing the supporting substrate, polyimide of a commercially available double-layer (copper/polyimide) flexible substrate may be processed by a laser to form holes for the outer-connecting areas and so on.

Next, the die bond films 4 formed as described above were each bonded to the semiconductor chip mount region of the supporting substrate [FIG. 1B]. These were bonded under conditions of, e.g., temperature: 160° C.; time: 5 seconds; and pressure: 3 kgf/cm2. Here, the die bond films were bonded at metal pattern areas of the wirings so that they do not adhere to the bonding sheet.

Next, on each die bond film thus bonded, a semiconductor chip 6 was bonded by the use of a silver-free paste 10 (trade name: EN-4322; available from Hitachi Chemical Co., Ltd.), followed by post-curing at 180° C. for 1 hour to cause the die bond film and silver-free paste to cure. Here, at the part where the wiring metal pattern was not present, an empty space 11 communicating with the through-hole 9 was formed between the die bond film and the bonding sheet.

Then, the semiconductor chip electrode and the inner-connecting areas were electrically interconnected by bonding gold wires 5 [FIG. 1C]. Those having been thus formed were set in a transfer mold, and were each encapsulated with a semiconductor sealing epoxy resin 7 (trade name: CL-7700; available from Hitachi Chemical Co., Ltd.) [FIG. 1D]. Thereafter, solder balls 8 were disposed and fused at the openings serving as the outer-connecting areas [FIG. 1E], followed by punching to make division into individual packages to obtain semiconductor packages [FIG. 1F].

The state of the empty space 11 of each package obtained was observed and also a reflow resistance test was carried out to obtain the results shown in Table 2 above.

The "Tg" shown In Table 2 is the one measured by thermomechanical analysis (TMA) at a temperature rise of 5° C./minute under a load of 5 g. The "residual volatile component" is the one obtained by calculating changes in weight of films of 5 cm long and wide before and after they were heated at 200° C. for 2 hours. With regard to the "reflow resistance", the packages were moisture-absorbed under conditions of 30° C./75%RH/96 hours and thereafter an IR (infrared) reflow test was carried out to observe visually any blisters in appearance. An instance where no blisters occurred was evaluated as "good"; and an instance where blisters occurred, as "poor".

Possibility of Industrial Application

As described above, in the present invention, the insulating film adhesive material is attached onto the wirings in the form of a tent. Thus, the function of a vent hole is not damaged, and also gases and water vapor which are generated from the insulating film adhesive material at the time of reflowing can be driven off surely outside the package. Hence, the present invention makes it possible to produce small-sized semiconductor packages preventive of package cracking and having a high reliability.

What is claimed is:

1. A semiconductor-chip supporting substrate for packaging comprising:

an insulating supporting substrate having at least one through-hole as a vent hole, said through-hole being disposed directly under a semiconductor chip and defining an inner side surface of the substrate;

at least two wirings being disposed on one surface of said insulating supporting substrate and having a semiconductor chip mounting region; and an insulating film adhesive material provided on the surface of said semiconductor chip mounting region, wherein said insulating film adhesive material has a glass transition temperature of 100° C. or above and a residual volatile component of 2.0% (weight by weight) or less at the time when a semiconductor chip is mounted via the insulating film adhesive material; and wherein a bottom surface of the insulating film adhesive material, said inner side surface of said substrate and an inner side surface of said wirings form an empty space therein which communicates to an open air through said through-hole.

2. A semiconductor device comprising:

the semiconductor-chip supporting substrate of claim 1;

a semiconductor chip mounted on the semiconductor chip mounting region; and a sealing member for encapsulating the semiconductor chip.

3. A semiconductor device comprising:

a semiconductor-chip supporting substrate for packaging, a semiconductor chip, and a sealing member for encapsulating said semiconductor chip, wherein said substrate comprises:

an insulating supporting substrate having a through-hole as a vent hole, said through-hole being disposed directly under the semiconductor chip and defining an inner side surface of the substrate;

at least two wirings being disposed on one surface of said insulating supporting substrate and having a semiconductor chip mounting region; and an insulating film adhesive material provided on the surface of said semiconductor chip mounting region, said insulating film adhesive material having a glass transition temperature of 100° C. or above and a residual volatile component of 2.0% (weight by weight) or less at the time when the semiconductor chip is mounted via the insulating film adhesive material; and wherein a bottom surface of the insulating film adhesive material, said inner side surface of said substrate and an inner side surface of said wirings form an empty space therein which communicates to an open air through said through-hole.

* * * * *